United States Patent
Crafts

[19]

[11] Patent Number: 5,907,511
[45] Date of Patent: May 25, 1999

[54] ELECTRICALLY SELECTABLE REDUNDANT COMPONENTS FOR AN EMBEDDED DRAM

[75] Inventor: Harold S. Crafts, Colorado Springs, Colo.

[73] Assignee: LSI Logic Corporation, Milpitas, Calif.

[21] Appl. No.: 08/997,503

[22] Filed: Dec. 23, 1997

[51] Int. Cl.⁶ ................................................. G11C 7/00
[52] U.S. Cl. ............... 365/191; 365/230.03; 365/230.06; 365/200
[58] Field of Search .................... 365/210, 201, 365/230.03, 230.01, 200, 191, 230.06, 186

[56] References Cited

U.S. PATENT DOCUMENTS

| | | | |
|---|---|---|---|
| 4,866,676 | 9/1989 | Crisp et al. | 365/200 |
| 5,208,778 | 5/1993 | Kumanoya et al. | 365/201 |
| 5,231,319 | 7/1993 | Crafts et al. | 307/603 |
| 5,270,977 | 12/1993 | Iwamoto et al. | 365/201 |
| 5,323,348 | 6/1994 | Mori et al. | 365/200 |
| 5,325,334 | 6/1994 | Roh et al. | 365/201 |
| 5,373,472 | 12/1994 | Ohsawa | 365/201 |
| 5,375,095 | 12/1994 | Yamada et al. | 365/230.03 |
| 5,386,386 | 1/1995 | Ogihara | 365/200 |
| 5,388,104 | 2/1995 | Shirotori et al. | 371/21.1 |
| 5,440,517 | 8/1995 | Morgan et al. | 365/202 |
| 5,471,482 | 11/1995 | Byers et al. | 371/21.2 |
| 5,502,675 | 3/1996 | Kohno et al. | 365/200 |
| 5,517,450 | 5/1996 | Ohsawa | 365/200 |
| 5,577,004 | 11/1996 | Leshem | 365/230.03 |
| 5,623,640 | 4/1997 | Nakabo | 395/497.01 |
| 5,650,975 | 7/1997 | Hamade et al. | 365/230.01 |
| 5,668,755 | 9/1997 | Hidaka | 365/182 |
| 5,689,466 | 11/1997 | Quereshi | 365/201 |
| 5,694,355 | 12/1997 | Skjaveland et al. | 365/149 |
| 5,825,682 | 10/1998 | Fukui | 365/49 |

*Primary Examiner*—David Nelms
*Assistant Examiner*—Thong Le
*Attorney, Agent, or Firm*—Wayne P. Bailey; John R. Ley

[57] ABSTRACT

A DRAM array embedded in an IC, ASIC or a SLIC includes a plurality of redundant functional elements and a substitution circuit which responds to signals communicated from a bus to electrically connect selected ones of the redundant elements as fully functional replacements for corresponding defective elements of the DRAM array. The redundant elements include bit blocks and word line groups. The substitution circuit includes a controllable selector which electrically connects selected ones of the bit blocks and word lines to respond to data and address signals communicated on the bus. A register responds to bus control signals and supplies signals to achieve connection of the redundant elements. The defective elements are identified, and the replacement redundant elements are substituted, by testing the elements of the DRAM array for proper functionality and processing the results of the test.

30 Claims, 3 Drawing Sheets

5,907,511

ELECTRICALLY SELECTABLE REDUNDANT COMPONENTS FOR AN EMBEDDED DRAM

CROSS REFERENCE TO RELATED INVENTIONS

This invention is related to inventions for a "Reprogrammable Address Selector for an Embedded DRAM" and "Reprogrammable Addressing Process for Embedded DRAM," described in U.S. patent applications Ser. Nos. (96-110) and (97-142), respectively, filed concurrently therewith and assigned to the assignee hereof. The disclosures of these concurrently filed applications are incorporated herein by this reference.

This invention generally relates to dynamic random access memory (DRAM) which is embedded in an integrated circuit (IC) such as an application specific integrated circuit (ASIC), a mixed signal ASIC or a system level integrated circuit (SLIC). More particularly, the present invention relates to new and improved embedded DRAMs for an IC which offer improved yields by achieving redundancy through electrical rather than physical techniques. In general, the improvements also relate to reducing the fabrication costs of each ASIC or IC.

BACKGROUND OF THE INVENTION

A DRAM is a memory element which holds and supplies information for use by electronic computing and logic elements, such as microcontrollers, microprocessors, logic arrays, and the like. An ASIC or a SLIC is a single IC which includes a combination of various electronic components, such as microcontrollers, microprocessors, logic gates, registers, amplifiers and the like, all of which have been selected, connected and integrated together to perform specific functions for a specific application. Examples of SLICs are controllers for computer memory disc drives, graphics controllers, LAN switches, fuel injector control systems for internal combustion engines, global positioning systems, and control devices for a wide variety of consumer products, among many other things. SLICs are desirable for use in mass produced products because of the enormous amount of functionality which can be created at a very low effective cost. These types of SLICs are sometimes referred to as a "system on a chip," because of the complete functionality obtained from the single chip or IC.

DRAMs have only recently been incorporated as part of SLICs. Previously, when the SLIC required memory to function, separate memories or DRAM chips were provided on a printed circuit board. Embedding DRAM in a SLIC avoids the additional cost of a separate memory chip. Avoiding the cost of the separate DRAM chip is attractive when the SLIC itself requires only a small amount of memory, because separate DRAM chips are relatively costly and of considerable memory size.

The typical semiconductor fabrication process almost always creates some number of defective chips, simply because of the complexity of the fabrication process and the large number of variables which must be precisely controlled during the process to obtain a fully functional chip. The number of fully functional chips created relative to the number of chips started or attempted is known as the "yield." If the yield is high, a lower effective cost per functional chip results, since the cost per chip is inversely proportional to the yield. Because of the highly competitive nature of semiconductor fabrication business, it is essential to obtain the highest possible yield to keep the individual costs of each functional chip as low as possible.

Fabrication of a SLIC with an embedded DRAM typically presents a much higher risk of defects and lower yields than the fabrication of a SLIC without an embedded DRAM. The DRAM is formed by tens or hundreds of thousands of repetitive and closely spaced components, resulting in a very high "density" of elements. High densities inherently create a greater possibility of defects arising during fabrication. Thus, embedding a DRAM in a SLIC simply raises the risk of reduced yields and a higher effective cost for each of the functional SLICs produced.

The embedded DRAM portion of the SLIC usually represents a relatively small portion of the overall size of the typical SLIC. If this were not the case, it would be more cost effective to use a separate DRAM chip in combination with the SLIC. The impact of a defect arising from a defective DRAM portion of the SLIC is therefore typically much greater than its contribution toward the size and cost of the complete SLIC. It is perhaps for these reasons and others that DRAMs have not been embedded in SLICs on a widespread and commercial basis.

In contrast, commercial DRAM chips are fabricated with special DRAM fabrication processes that have been specifically developed to address the unique fabrication requirements of DRAMs. These DRAM processes have evolved over many years to improve density and enhance yields. However, these special DRAM processes are not particularly attractive for use in fabricating SLICs with embedded DRAMs, because many of the other non-DRAM components of the SLIC do not require or respond favorably to such special DRAM fabrication process. Thus, the special DRAM fabrication process is usually unnecessary and potentially expensive when applied to the remainder of the SLIC. The relative size contribution of the embedded DRAM to the overall size of the SLIC often will not justify the use of a special DRAM fabrication process, even if the DRAM fabrication process could be favorably applied to the remaining elements of the SLIC. Furthermore, the influences from the other non-DRAM components of the SLIC, such as noise, may require DRAM circuit designs which are not optimal for response to such special DRAM fabrication processes.

In order to address the defect problem in fabricating semiconductor chips, it is typical to include redundant elements. Upon detecting a defective element by testing after fabrication, the defective element is bypassed and one of the redundant elements is substituted in its place. In this manner the chip can be salvaged and made fully functional.

Redundancy is typically implemented by using a laser to explode or evaporate conductors formed in the chip, thereby physically disconnecting the defective components and substituting the functional redundant components. However, this laser programmed redundancy technique is not cost-effective in the circumstance of a relatively small size contribution of the embedded DRAM to the SLIC. The cost of the laser and the testing equipment is significant, as is time and costs to program and apply the laser to the minute pattern of DRAM conductors and components on the chip. A standard SLIC test environment must be maintained to test the SLIC, because of the high relative proportion of non-DRAM components and to assure proper functionality of the SLIC itself. If the costs of laser programmed redundancy were added to the standard SLIC test processes, the resulting test procedure would not be standard and could possibly escalate the costs of fabrication to the point of making the entire SLIC process cost-ineffective.

These considerations are further complicated by the differing requirements for embedded DRAM for a variety of different SLICs. Typically a SLIC manufacturer will have a "library" of standard component designs which can be incorporated together in creating the SLIC, because of the wide variety of different circuitry which may be required in different SLICs. The standard library designs will include, for example, arrays of logic gates, microprocessors, DRAMs and the like. The cost effectiveness of competing in the SLIC fabrication market depends on the ability to integrate the standard library designs together in creating the SLIC, without specifically having to redesign each component each time it is used in a different SLIC. Generally, successfully integrating different standard designs will require the ability to physically reposition the standard components on the chip to accommodate differing customer requirements. Repositioning a DRAM makes it difficult to program a laser to achieve redundancy, because the different positions and amounts of DRAM which may be incorporated on different SLICs require separate and different programs to control the laser.

Furthermore, testing the SLIC is complicated by the different contributions and combinations of the standard designs, since a method must be devised to specifically test each component, even though the components may be combined in different patterns and relationships in different SLICs. Developing a unique test program for each different SLIC can also increase the overall costs of the SLIC.

For all of the above reasons, and others, it is important to use standard manufacturing and testing process for the different types and configurations of SLICs, including those with embedded DRAM. Using such standard processes reduces costs. It is with respect to these and other considerations that the present invention has evolved.

SUMMARY OF THE INVENTION

An important improvement of the present invention relates to embedding DRAM in a SLIC in such a manner that standard fabrication and testing processes may be employed to manufacture the SLIC without adding significant cost and complexity beyond that which would normally be required for a SLIC. Another important improvement of the present invention is to achieve redundancy in the DRAM portion of the SLIC on an electrical basis rather than on a physical basis, thereby avoiding the significant costs and difficulties associated with implementing conventional laser programmed and other physical redundancy techniques. A further improvement relates to achieving inherent electronic redundancy in DRAMs beyond the redundancy achieved as part of the semiconductor fabrication process to overcome latent defects which appear only after the chip had been placed in use. Still another improvement relates to electrically selecting redundant bit blocks and word line groups of a segment of a DRAM memory array to eliminate defective components and substitute fully functional components.

These and other improvements are implemented in a DRAM array embedded in an IC, preferably a SLIC. The IC includes a bus connected to the DRAM array by which signals are communicated with the DRAM array. The DRAM array includes a plurality of redundant functional elements. A substitution circuit of the DRAM array responds to signals communicated from the bus to electrically connect selected ones of the plurality of redundant elements as fully functional replacements for corresponding defective elements of the DRAM array. Defective elements and any not-selected redundant elements are electrically disconnected from operation within the DRAM array.

Preferably, the redundant elements comprise bit blocks and groups of word lines. The substitution circuit includes a controllable selector which electrically connects selected ones of the bit blocks and word line groups to respond to data and address signals communicated on the bus. A bit line decoder is associated with each bit block, and the bit line decoder responds to bit line address signals. The controllable selector connects bit lines identified by the bit line decoder to the bus. A word line decoder is connected to the bus to receive the word line address signals and to deliver a word line select signal thatl. The controllable selector activates selected groups of the word lines which are identified by the word line address signals. As a preferred way to maintain the electrical connection established by the controllable selector, a register controller responds to bus control signals and supplies substitution signals to effect the electrical connection of the redundant elements. The defective elements are identified, and the replacement redundant elements are substituted, in response to testing the elements of the DRAM array for proper functionality. Once the test information is obtained, the substitutions are accomplished. Preferably the test to determine proper functionality is performed each time that power is supplied to the DRAM array.

Other improvements of the present invention are implemented by a method of substituting selected ones of a plurality of redundant functional elements for defective elements in a DRAM array embedded in an IC, preferably a SLIC. The method comprises the steps of electrically switching selected ones of the plurality of redundant elements into operation in the DRAM array as fully functional replacements for corresponding defective elements of the DRAM array, electrically switching the defective elements and any not-selected redundant elements out of operation in the DRAM array, and sending substitution signals on a bus of the IC to control the electrical switching.

Preferably, the substitution signals are stored in registers, and the selected ones of the redundant elements which are to be substituted and switched out of operation are established in response to signals in the registers. The method also preferably includes executing a test program for testing the redundant components of the DRAM array, determining the functional and defective components based on the results of the test program, and determining which of the redundant elements to electrically switch into and out of operation based on the results of the test program.

Because the DRAM redundancy is created by electrical switching in accordance with the present invention, standard SLIC fabrication procedures can be used because the redundancy switching is achieved through DRAM circuit components fabricated in the same manner as the other components of the SLIC. The electrically-implemented redundancy avoids the use, cost and difficulty of laser programmed and other physical redundancy techniques. Furthermore, a standard SLIC test procedure is all that is required to test the SLIC including the DRAM after fabrication, thereby avoiding the complications of adding additional test procedures that would otherwise be required by laser programmed redundancy techniques, for example. The electrically-implemented redundancy further offers the advantage of allowing the SLIC to eliminate latently defective components which exhibited sufficient functionality to pass the initial fabrication test but which failed after some period of use of the SLIC.

A more complete appreciation of the present invention and its scope can be obtained by reference to the accompanying drawings, which are briefly summarized below, to the following detailed description of presently preferred embodiments of the invention, and to the appended claims.

DETAILED DESCRIPTION

Figure 1:
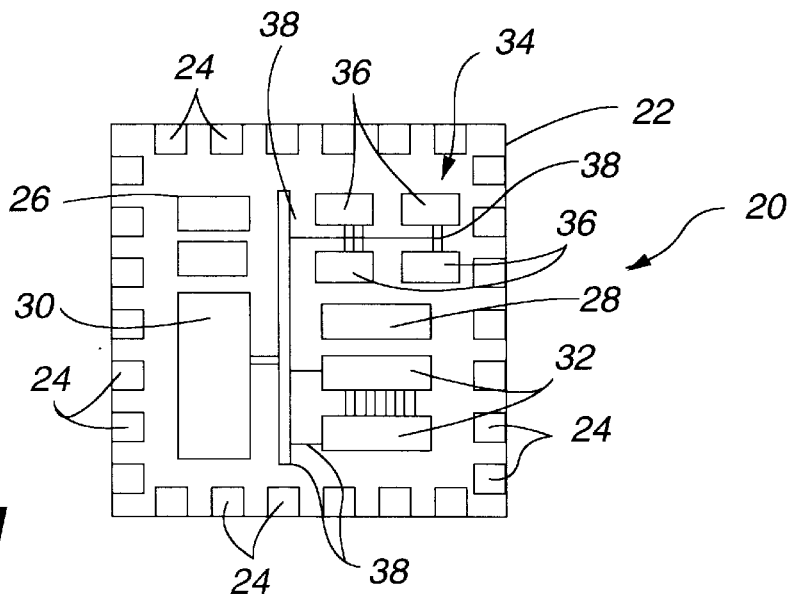
FIG. 1 is an overall layout illustration, not necessarily to scale or in proportion, illustrating a typical SLIC with an embedded DRAM array within which the present invention is incorporated.

A system level integrated circuit (SLIC) 20 which incorporates the present invention is generally shown in illustrative, not-to-scale and not-to-proportion form in FIG. 1. Other than the present invention, the SLIC 20 is conventional. The SLIC 20 is formed as an integral unit on a die or chip 22. Pads 24 are formed on the exterior of the chip 22 by which to connect external electrical conductors (not shown), once the chip 22 has been packaged in a standard IC package (also not shown). The pads 24 are connected by internal conductors to the various functional components of the SLIC 20. The functional components of the SLIC 20 will vary according to the SLIC, but in general those components will include a processor 26, a read only memory (ROM) 28, logic arrays 30, and registers 32, for example, as other well known digital or analog components.

Included in the SLIC 20, or other IC, is an embedded dynamic random access memory (DRAM) array 34, which incorporates the present invention. The embedded DRAM array 34 is formed by a plurality of separate DRAM segments 36 which are interconnected by electrical conductors forming a bus 38 on the chip 22. The bus 38 also connects to many of the other components of the SLIC, including the processor 26. The bus 38 is of the standard configuration having a plurality of separate conductors which are generally located parallel to one another and over which control, address and data signals are transmitted between the various components 26, 28, 30, 32, and 36, etc. In general, the numbers, types and layouts or positions of the specific SLIC components on the chip 22 will vary according to each different SLIC.

The amount of embedded DRAM in the array 34 is generally established by replicating the number of individual DRAM segments 36. For ease in SLIC fabrication, the DRAM segments 36 are designed as separate integral units of a specific memory size, for example, 64 Kbits arranged in 8 bit words. Although four separate DRAM segments 36 are shown in FIG. 1, it is not unreasonable to expect that some SLICs may require as much as 1–4 Mbits of memory, thereby requiring at least 16–64 separate 64 Kbit DRAM segments 36 to be reproduced and interconnected on the chip 22, for example. Of course, the position or layout of those DRAM segments 36 will usually vary from one SLIC chip to another, because the layout of each different SLIC chip is different. Thus, one of the benefits of the present invention is that it allows each DRAM segment 36 to be easily replicated, reconfigured and tested as an independent unit and in a manner which is substantially independent of its position or location on the SLIC chip. Testing and reprogramming are discussed more completely in the two previously mentioned patent applications.

Figure 2:
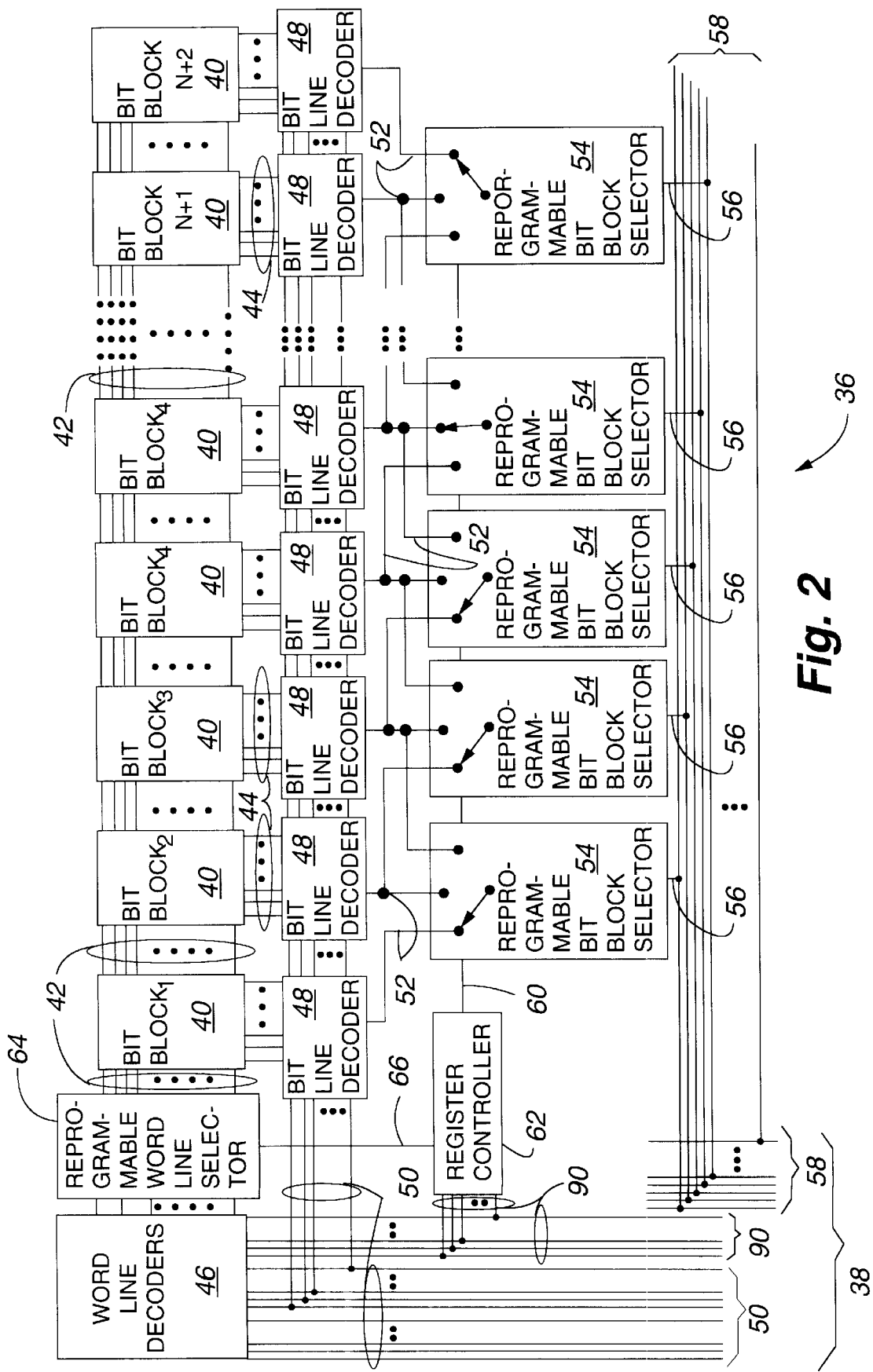
FIG. 2 is a block diagram of a segment of the embedded DRAM array shown in FIG. 1.

More details of each embedded DRAM segment 36 are shown in FIG. 2. Each DRAM segment 36 is formed by a plurality of bit blocks 40. Each bit block 40 has the conventional DRAM construction of a matrix-like configuration of individual DRAM cells (not shown) arranged in horizontal rows and vertical columns. The individual DRAM cells in specific rows of the bit block are interconnected internally within the bit block 40 in the conventional manner by word lines. External word line conductors 42 connect the corresponding word lines in all of the bit blocks 40 in the DRAM segment 36. The individual DRAM cells in the vertical columns within each bit block 40 are interconnected internally in the conventional manner by bit lines. External bit line conductors 44 connect to the corresponding internal bit lines within the bit blocks 40 to external components.

Each DRAM cell of each bit block 40 is intended to accept and hold information, in the form of a high or low electrical signal known as a "bit." The bit signal information is stored or "written" into each cell by sending a high or low signal to the particular cell. Information is recovered or "read" from the cell by accessing the cell and sensing the high or low state of the signal held by the cell. Individual cells within the bit blocks 40 are accessed by signals sent over the word lines 42 and the bit lines 44. By uniquely selecting one word line and one bit line, the singular DRAM cell located at the intersection of selected word and bit lines is activated for writing or reading. By selecting one bit line in each block, a "word" is formed by the bits of all of the selected bit blocks. The width or number of bits in the word is determined by the number of activated bit blocks 40.

Conventional word line and bit line decoders, 46 and 48 respectively, are connected to a group of conductors of the bus 38 which form an address bus 50. The word line and bit line decoders 46 and 48 are physically constructed to respond to predetermined address signals supplied on the address bus 50, although the Reprogrammable Address Selector patent application mentioned above describes a technique for substituting a new logical address for the fabricated physical address. The address signals cause the decoders 48 and 46 to energize the bit line conductors 44 and a specific one or groups of word line conductors 42, respectively, which correspond to the address signals decoded by the decoders 46 and 48. The energized word and bit line conductors 42 and 44 activate the memory cells of the bit blocks 40 at the intersection of the energized word and bit line conductors. The activated memory cells allow information to the read from the memory cells or written to the memory cells over the bit line conductors 44. Only one bit signal is supplied from or to each bit block 40 in response to a singular combination of word and bit address signals.

Because the word lines 42 of all of the bit blocks 40 are connected together, the word line decoder 46 energizes all of the corresponding word lines in all of the bit blocks 40 of the DRAM segment 36. The bit line decoders 48, on the other hand, select individual columns within their associated bit blocks. A selected number of the bit line decoders 48 will respond to the same address, thus resulting in the simultaneous presentation of words of information. The words may 8, 16, 32 or even 64 bits of information, for example. Furthermore, the words from one DRAM segment 36 may be combined with the words obtained from another DRAM segment to obtain the total width or quantity of information dealt with by the processor 26 (FIG. 1) during each cycle.

Each DRAM segment 36 must supply its predetermined number of bits of information necessary to constitute the words. The DRAM segment 36 will be defective if it has too many defective bit blocks 40 or word lines 42 to supply the necessary number of bits of information. A bit block will not be functional when, due to defects arising from the fabrication process, it is not possible read data from and write data to the memory cells in a reliable manner. For this reason, each DRAM segment 36 will include one or more extra bit blocks 40 as redundant components to allow one or more defective bit blocks 40 to be eliminated and replaced with a fully functional redundant bit block, and thereby obtain a fully functional DRAM segment 36. In the example shown in FIG. 2, two extra bit blocks 40 (N+1 and N+2) are illustrated, assuming that N bit blocks are required for a fully functional DRAM segment 36. In addition, each DRAM segment 36 will include one or more groups of word lines as redundant components to allow defective word lines to be eliminated and replaced with fully functional word lines. The ability to replace defective bit blocks, bit lines and word line groups increases the chances of obtaining a fully functional DRAM segment 36.

Replacing defective bit blocks and defective word line groups by fully functional redundant bit blocks and word lines is achieved by reprogrammable bit block selectors 54 and reprogrammable word line selectors 64, in the present invention. The reprogrammable bit block and word line selectors 54 and 64 are exemplary parts of substitution circuits which operate electrically in response to control signals, allowing the redundant elements to be substituted effectively by electrical procedures rather than by the more expensive and difficult physical procedures, such as laser programmed redundancy.

The reprogrammable bit line selectors 54 are connected to a conductor 52 extending from the bit line decoder 48. The bit line decoder 48 connects the one of the bit line conductors 44 to the conductor 52. The reprogrammable bit block selector 54 is connected by a conductor 56 to one of a group of conductors 58 of the bus 38 which constitute a data bus. Signals from the memory cells, after amplification by conventional sense amplifiers (not shown) are conducted through the reprogrammable bit block selectors 54 and applied on the conductors 56 and on the data bus connectors 58 during "read" operations of the DRAM segment 36. Similarly, signals from the data bus conductors 58 are supplied on the conductors 56 to the reprogrammable bit block selectors 54 and conductors 52 to the one of the bit lines 44 selected by the bit line decoder 48 during "write" operations. Although shown in FIG. 2 as a singular data bus, the data bus conductors 58 could form separate data-in and data-out buses. Tri-state amplifiers (not shown) are typically connected between each conductor 56 of the data-out bus, and may optionally be connected between each conductor 56 and the data-in bus, as is described in the two previously mentioned applications.

In general, each bit block selector 54 functions as a three position switch (as shown schematically in FIG. 2) to eliminate defective bit blocks 40 from the DRAM segment 36 and substitute redundant, fully functional bit blocks in place of the defective bit blocks. The position of the switch and the resulting connectivity of the bit block selector 54 is established by substitution control signals supplied on a conductor 60 from a register controller 62. For example, FIG. 2 shows that bit block 3 is defective and is therefore disconnected to prevent its operation in the DRAM segment 36. Starting from the left as shown in FIG. 2, the first and second bit block selectors 54 connect bit blocks 1 and 2 to the data bus 58, but the third bit block selector 54 connects bit block 4 to the data bus 58. Bit block 3 is thereby eliminated. Similarly, the last or most right hand (as shown in FIG. 2) bit block selector 54 connects the most right hand (as shown) bit block N+2, indicating that one additional bit block 40 within the DRAM segment 36 is defective.

The advantage of using a three position connectivity switch or arrangement within each bit block selector 54 is that one of three bit blocks may be selected. Of course, once a preceding bit block selector 54 has selectively eliminated a defective bit block 40, the number of available choices for all subsequent bit block selectors 54 is reduced by one. The selection of a preceding bit block, a directly associated bit block, or a following bit block, is accomplished by the substitution control signals supplied on a conductor 60 by a register controller 62.

A similar capability to implement redundancy with respect to word line groups is achieved by a reprogrammable word line selector 64. The reprogrammable word line selector 64 connects selected word line groups of the bit blocks 40 to respond to the word line addresses established by the word line decoder 46, thereby diverting the word line signals from the defective word line and word line groups to the selected, fully-functional redundant word line and word line components. The word line selector 64 also preferably functions as a three position switch (as shown schematically in FIG. 3) and also operates in response to substitution control signals supplied on a conductor 66 from the register controller 62 to establish the position and conductivity of the switch within the reprogrammable word line selector 64.

Figure 3:
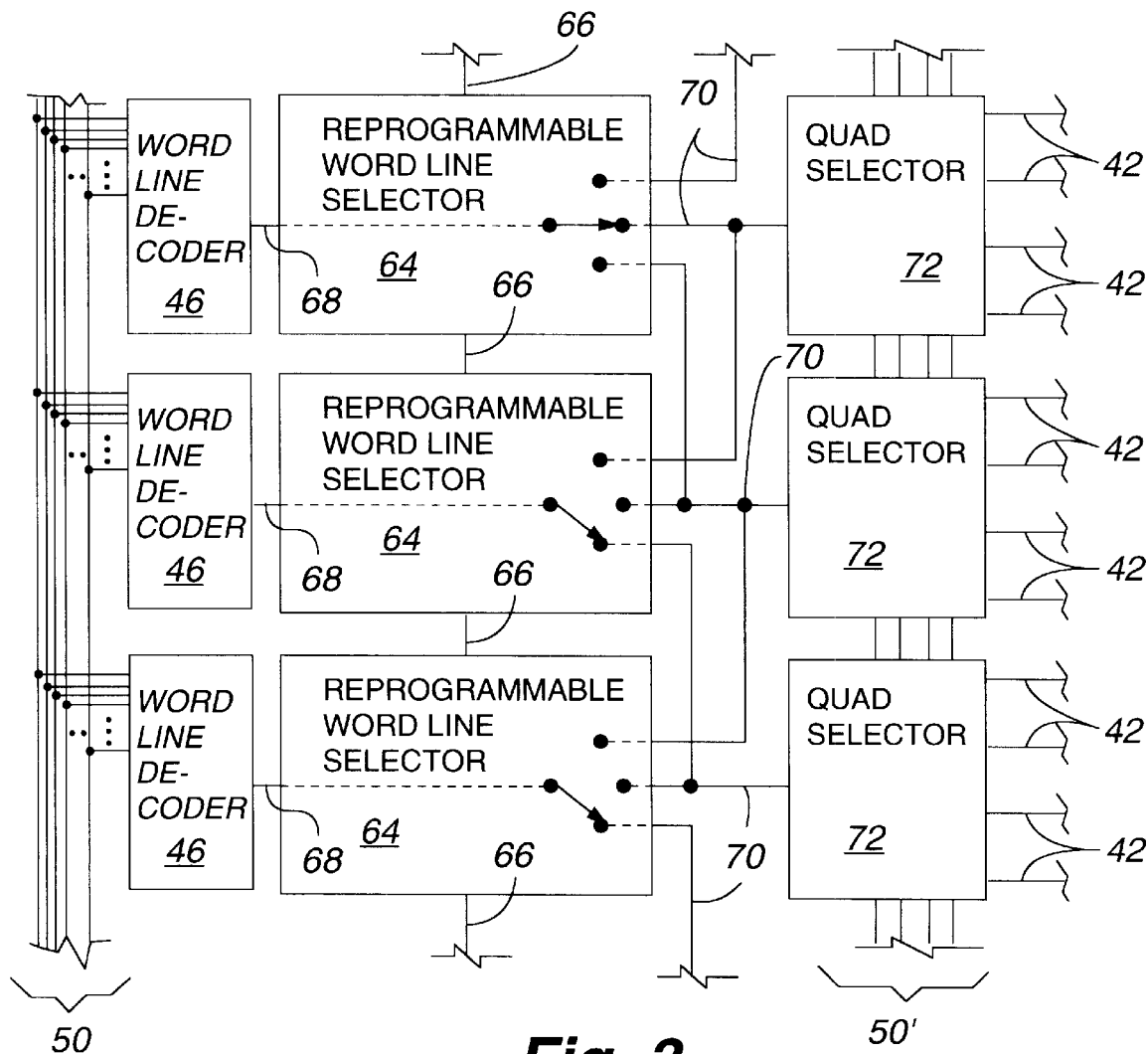
FIG. 3 is an expanded block diagram of a word line decoder and a reprogrammable word line selector shown in FIG. 2.

The word line decoders 46 and the reprogrammable word line selectors 64 are shown in more detail in FIG. 3. The word line decoders 46 are connected to the address bus conductors 50, and respond to particular word line address signals supplied on those conductors 50. In response to its corresponding word line address signals, each word line decoder 46 supplies a word line select signal at 68 to its associated reprogrammable word line selector 64. Previously, the word line selector 64 has established a connectivity condition through its three position switch in response to the substitution control signals 66 supplied from the register controller 62 (FIG. 2). The word line select signal at 68 is conducted through the word line selector 64 and supplied on conductors 70 to a selected quad line selector 72. The quad line selector 72 which receives the word line select signal is established by the position or connectivity of the three position switch of the switch selector 64.

For example, the upper (as shown) reprogrammable word line selector 64 has its conductivity established with its directly associated upper (as shown) quad selector 72. Thus, the quad select signal from the uppermost (as shown) word line decoder 46 is supplied through the word line selector 64 over the conductors 70 to the directly associated quad selector 72. However, the word line select signal supplied by the middle (as shown) word line decoder 46 is conducted through the middle (as shown) word line selector 64 to the lowermost (as shown) quad selector 72, because the connectivity position established by the middle (as shown) word line selector 64 diverts the word line select signal away from the directly associated middle (as shown) quad selector to the lowermost quad selector. Therefore, the middle quad selector 72 does not receive a word line select signal on the conductors 70, and the word lines 42 connected to the middle quad selector 72 are eliminated from use in the DRAM segment 36 (FIG. 2) and the word lines 42 connected to the lower quad selector 72 are substituted in their place. Such a substitution would occur as a result of a defect in the word lines 42 and word line components associated with the word lines connected to the middle quad selector 72.

The quad selectors 72 are conventional and function to select one of the four word lines 42 in response to quad select signals applied on the address bus conductors 50'. The signals at 50' are in essence the lower order address signals from the address bus 50. Each quad selector responds to the lower order quad address signals 50' and selects the one of the word lines 42 identified by that quad address signal. The quad selectors 72 therefore conduct the word line select signal from the conductors 70 to the selected word line 42. The quad selectors 72 also typically include amplifiers to increase the gain of the signal supplied by the word line decoder 46, thus assuring that all of the components of the selected word line 42 are energized and activated. Although a plurality (four) of word lines form the group connected to each quad selector 72, as shown, a single word line could form the group. In the case of a single word line group, the selector 72 would not be used because the word line selection would be accomplished by the word line decoder 46. In general, the quad selector 72 is one example of a group word line selector to which a group of word lines may be connected and addressed.

Figure 4:
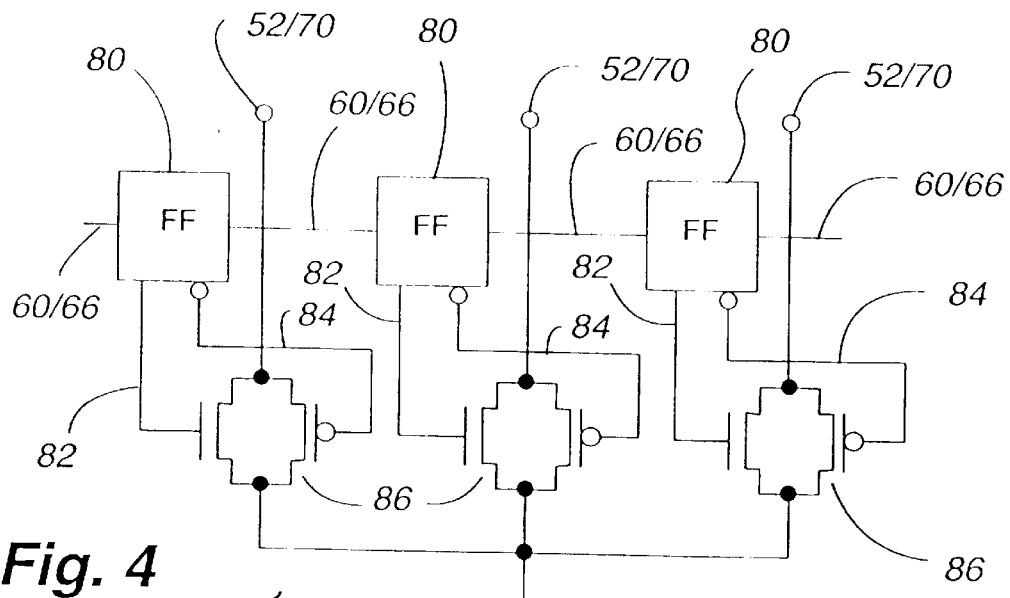
FIG. 4 is a schematic diagram of one embodiment of reprogrammable bit block selector shown in FIG. 2 or a reprogrammable word line selector shown in FIG. 3.

The circuitry to implement both the reprogrammable bit block selectors 54 and the reprogrammable word line selectors 64 may be essentially the same. One example of a reprogrammable bit block or word line selector 54/64 is shown in FIG. 4. The selector 54/64 includes three conventional flip flops (FFs) 80 which are connected in series to form a serial shift register. The substitution control signal on conductor 60/66 is a serial signal which is serially or sequentially clocked or shifted into the flip flops 80. The sequence of high and low values of the signals which are shifted into the flip flops 80 are delivered from the register controller 62 (FIG. 2). All of the flip flops 80 of all the word line selectors 64 and bit block selectors 54 of the DRAM segment 36 (FIG. 2) are loaded in this same manner over the single conductor 60/66. Use of the single conductor 60/66 conserves valuable space on the SLIC 20 (FIG. 1). As an alternative, all of the flip flops 80 could be connected in parallel to the control register 62 (FIG. 2) by a bus-like collection of separate control conductors.

Once all of the flip flops 80 in all of the selectors 54/64 have been loaded with the desired values, the flip flops 80 are set so that output signals on the conventional D and not D flip-flop terminals 82 and 84, respectively, are supplied. The flip-flop output signals bias a pair of complementary transfer gate transistors 86. Only one of the complementary sets of transfer gate transistors 86 is biased into a conductive state in each selector 54/64. The other two complementary sets of transfer gate transistors 86 are biased into a nonconductive state. The conductive transfer gate transistors 86 connect one of the conductors 52/70 to the conductor 56/68. The other two conductors 52/70 are connected to the nonconductive transfer gate transistors 86 and are thus disconnected from the conductor 56/68. By selecting the proper sequence of high and low signals at 60/66 to load into the flip flops 80, the desired one of the conductors 52/70 from the selector 54/64 is selected and the redundant DRAM components connected to that conductor 52/70 are activated or enabled for operation.

Figure 5:
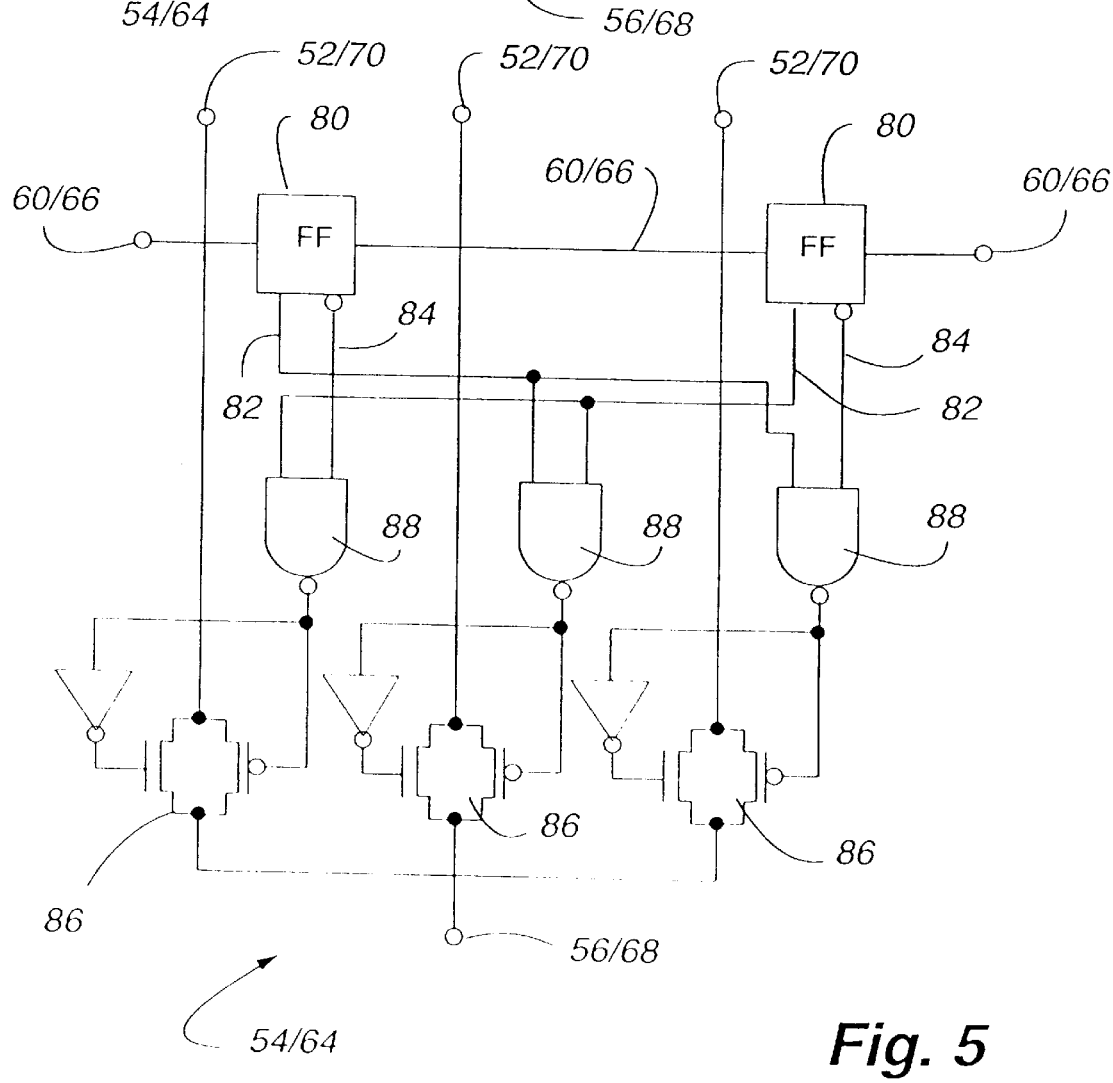
FIG. 5 is a schematic diagram of an alternative embodiment of the selector circuit shown in FIG. 4.

Another example of a reprogrammable selector 54/64 which requires only two conventional flip flops 80 is shown in FIG. 5. The flip flops 80 shown in the FIG. 5 embodiment of the selector 54/64 have their D and not D output terminals 82 and 84 connected to three NAND gates 88. The NAND gates 88 respond to the four signals from the two flip flops 80 and logically select only one of the three transfer gate transistor pairs 86 to bias into a conductive state, while the other two transfer gate transistor pairs 86 are biased into a nonconductive state.

The reprogrammable bit block and word line selectors 54/64 shown in FIGS. 4 and 5 can be simplified by reducing the number of alternatives for redundant component connection from three to two. The amount of redundancy available is reduced, but the minimum number of flip flops required to implement the redundancy is also reduced from two to one. Reducing the number of flip flops used to implement the redundancy selection reduces the amount of space consumed.

The size of the redundant logic can be further reduced if the number of bit blocks 40 (FIG. 2) is made larger, for example 32 bit blocks instead of 8 bit blocks or 16 bit blocks. Increasing the number of bit blocks 40 reduces the number of bit lines 44 in each bit block 40 and hence reduces the number redundant memory cells and supporting circuitry that is required. In a 0.5 micron process, for example, a 64K memory segment occupies less than two square millimeters. If the defect density of the fabrication process is on the order of one defect per square centimeter, the yield of the individual DRAM segments should be in the neighborhood of 95% to 98%. If a DRAM array of 64 DRAM segments 36 is required (4 megabits, in this example), redundancy is still necessary to improve the yield to the 80% to 90% range. Bit block redundancy should be adequate to achieve these yields in relatively large DRAM arrays, when the bit block redundancy is coupled with DRAM segment redundancy as is described in the previously mentioned Reprogrammable Address Selector patent application. The yield of individual word line groups and bit blocks should be sufficiently high so that only one redundant word line group or bit block should be required to achieve satisfactory results.

The extent and the complexity of conductors required to supply the control signals to the flip flops 80 is also reduced because of the ability to serially load the flip flops with the substitution signal which controls the connectivity of the selectors 54/64. The use of the single conductor 60/66 conserves valuable space on the SLIC chip.

An alternative to the use of serial shift registers in the reprogrammable selectors 54/64 is to obtain the data for programing the bit block selectors 54 from the data bus 58 (FIG. 2) and the data for programing the word line selectors 64 from the address bus 50 (FIG. 2). This data would be written to the buses in the memory cycle after the DRAM segment is selected with its physical address, as is described more completely in the two previously mentioned applications.

Flash memory or another type of non-volatile memory could be employed in place of the register flip flops 80 (FIGS. 4 and 5). Using non-volatile memory in this manner avoids the necessity to send control signals at 60/66 each time that power is initially applied to the SLIC, because the non-volatile memory would retain the programmed signal levels. Of course, the semiconductor fabrication process for SLIC must accept the fabrication process for the flash or other non-volatile memory elements as part of its overall application process.

The substitution control signals 60 and 66, which are supplied by the register controller 62, are derived from control signals supplied on control signal conductors 90 of the bus 38, as shown in FIG. 2. The signals supplied on the control signal bus 90 are supplied by the processor 26 (FIG. 1), and these control signals are derived after testing to determine the functional components of the DRAM array. The testing may occur after fabrication, as a result of conducting a fabrication test program, or the testing may occur subsequently after the SLIC is placed in use, as a result of conducting a conventional built in self test (BIST). The testing procedure is more completely described in the previously mentioned patent applications.

In the case of a BIST, the processor 26 and the ROM 28 of the SLIC 20 (FIG. 1) execute the BIST software functionality to determine the defective components. Based on the results of the BIST, the processor derives the control signals which are supplied on the control signal bus 90 to the register controller 62 to cause the reprogrammable bit block and word line selectors 54/64 to connect fully functional bit blocks 40 and word lines and word line components as part of the DRAM segment 36. The defective bit blocks 40, word lines and word line components are eliminated from operation.

To initially determine which, if any, of the bit blocks 40 and word lines 42 and word line components are defective, the control signals 60 and 66 initially set the reprogrammable selectors 54 and 64 to connect all of the bit blocks and word lines and word line components to be tested. The BIST or initial fabrication defect test is thereafter conducted. The BIST test protocol thereafter tests the bit blocks and the word line components using this initial address. The information gained from the test identifies the bit block and word line components which are defective. Based on the defective bit block and word line component information, the BIST functionality develops the data to identify the defective components and to substitute the redundant fully functional components for the defective components. The BIST functionality thereafter writes a series of substitution control signals which are serially shifted over the conductor 60/66 into each flip-flops 80 of each bit block and word line selector 54/64 (FIGS. 4 and 5). The signals at 82 and 84 from the flip flops 80 establish the connectivity through the transfer gate transistors 86 to connect only functional bit blocks 40 to the data bus 78 (FIG. 2). Thereafter, another BIST test is conducted to determine whether the redundancy just implemented has achieved a fully functional DRAM segment. If not, the BIST test is repeated and additional information on any remaining defective components is developed, and that information is then again used to reprogram the bit block selectors 54 and the word line selectors 64 to achieve a fully functional DRAM segment 36.

Having the capability to eliminate defective bit blocks 40 by use of the reprogrammable bit block selectors 54, and to eliminate defective word line components by use of the reprogrammable word line selectors 64, provides the maximum capability to retain functional components of the DRAM segment 36. The determination to eliminate defective bit blocks 40 from the DRAM segment 36, or to eliminate defective word line components from the DRAM segment 36, will be established by the extent and position of the defects detected. Of course, if the extent and location of the defects are such that redundancy can not be implemented, the DRAM segment is not salvageable and it is disconnected to prevent it from operating. The manner in which a defective DRAM segment is eliminated from operation within the SLIC is described more completely in the previously mentioned Reprogrammable Address Selector patent application.

Another improvement available from the reprogrammable bit block and word line selectors 54/64 is the capability to offer continual redundancy to avoid malfunctions arising from latent defects. Normally, laser programmed redundancy techniques are employed to eliminate defective components from the SLIC based on tests conducted immediately after the SLIC is fabricated. Thereafter once redundancy is accomplished, the SLIC is considered fully functional. This does not solve the problem of latently defective elements caused by defects which manifest themselves only after the SLIC has been placed in use. While a BIST may be run each time the power is initially applied to the SLIC, when it is placed in use to notify the user of subsequently developed defects, there was no known technique to replace latently defective components which only reveal the defect after some period of use. However, with the reprogrammable selectors 54/64, the ability to reprogram defective bit blocks, word lines and DRAM segments to substitute fully functional redundant bit blocks, word lines and DRAM segments for latently defective components is always present as a result of the present invention. Such functionality can be achieved under the control of software at any time after the SLIC has been manufactured.

Furthermore, because the reprogramming is accomplished electrically, it is unnecessary to employ expensive laser programmed redundancy techniques to achieve redundancy as part of the fabrication of the SLIC. The redundancy is accomplished on an automatic basis under control of the SLIC operating software and the defect testing software, by reprogramming the functionality as previously described. An advantage in the fabrication of SLICs with embedded DRAM results, because the expense and time consuming nature of programming the laser equipment for the variable number of bit blocks, word lines and DRAM segments and their varying positions on the different SLIC chips is avoided. Under such variable conditions, the difficulty of programming the laser to accomplish redundancy is considerable, and the resulting expense of laser programmed redundancy techniques may increase the cost of the SLIC to a prohibitive point. The automatic and relatively straightforward approach of electrically reprogramming the address responsiveness of the bit blocks, word line groups and DRAM segments is a significant advantage, consistent with standard testing techniques and particularly with respect to fabricating embedded DRAM in SLICs.

Presently preferred embodiments of the invention and their improvements and advantages have been described. This description has been made by way of preferred example rather than as a restriction on the invention. The scope of the present invention is defined by the scope of the following claims, and not necessarily by the detailed description of the preferred embodiment set forth above.

The invention claimed is:

1. An embedded DRAM array which includes a bus connected to the DRAM array by which multiple signals are communicated with the DRAM array, said DRAM array comprising:

a plurality of redundant functional elements; and a substitution circuit responsive to a plurality of control signals communicated over the bus, the substitution circuit responding to each different control signal to electrically connect selected ones of the redundant elements as fully functional replacements for corresponding defective elements of the DRAM array and to electrically disconnect the defective elements and any not-selected redundant elements from operation within the DRAM array, the ones of the elements which are connected and disconnected determined by the control signals, the substitution circuit changing the connected and disconnected ones of the functional elements in response to each different subsequent control signal and without regard to the connection and disconnection of any previously connected and disconnected elements resulting from a previous control signal.

2. DRAM array as defined in claim 1 wherein said substitution circuit further comprises:
   a register responsive to each control signal communicated over the bus to supply a substitution control signal indicative of each selected redundant element to be connected as a replacement for a defective element; and
   a controllable selector connected to each redundant element and responsive to the substitution control signal to connect each selected element for communication with the bus and to disconnect each defective and not-selected element from communication with the bus.

3. A DRAM array as defined in claim 2 wherein:
   the controllable selector is connected to at least two redundant elements; and
   the controllable selector connects one of the redundant elements for communication with the bus and disconnects the other redundant element from communication with the bus in response to the substitution control signal.

4. A DRAM array as defined in claim 2 wherein:
   the controllable selector is connected to at least three redundant elements; and
   the controllable selector connects one of the three redundant elements for communication with the bus and disconnects the other two redundant element from communication with the bus in response to the substitution control signal.

5. A DRAM array as defined in claim 2 wherein:
   each controllable selector includes a register, the registers of all of the controllable selectors being connected in series, and the substitution control signal is a serial signal shifted serially into the serially-connected registers of the controllable selectors.

6. A DRAM array as defined in claim 2 wherein:
   the redundant elements comprise a plurality of bit blocks, the predetermined number of bit blocks being at least one greater than a predetermined number of bit blocks required for a fully functional DRAM array, each bit block comprising a plurality of bit lines; and
   the controllable selector comprises a bit block selector which connects selected ones of the bit blocks to the bus to read and write data signals to and from the bus.

7. A DRAM array as defined in claim 6 further comprising:
   a bit line decoder associated with each bit block, the bit line decoder connected to the bus to respond to bit line address signals; and wherein:
   the bit block selector connects the bit line decoder of the selected bit block to the bus.

8. A DRAM array as defined in claim 7 wherein:
   each bit block comprises a plurality of bit lines, a plurality of word lines, and a plurality of memory cells arranged in a matrix-like configuration with each cell connected to a bit line and a word line; and
   the controllable selector also comprises a word line selector which connects selected ones of the word lines of each bit block to function in response to bus word line address signals.

9. A DRAM array as defined in claim 8 wherein:
   the corresponding word lines of all of the bit blocks are connected together; and further comprising:
   a word line decoder connected to the bus to receive the bus word line address signals and to deliver a word line select signal in response to a predetermined word line address signal; and wherein:
   the word line selector is connected to the word line decoder to receive the word line select signal and apply the word line select signal simultaneously to all of the selected and connected word lines of the bit blocks.

10. A DRAM array as defined in claim 9 further comprising:
    a group word line selector connected to a predetermined group of word lines and to the word line selector, the group word line selector is further connected to the bus to receive word line address signals indicative of the ones of the group of word lines to which the group word line selector is connected; and wherein:
    the word line selector applies the word line select signal to the group word line selector; and
    the group word line selector applies the word line select signal to the selected one of the word lines of the group of word lines corresponding to the word line address signals applied to the group word line selector.

11. A DRAM array as defined in claim 2 wherein:
    the redundant elements comprise word lines; and
    the controllable selector comprises a word line selector which connects selected ones of the word lines to function in response to bus address signals.

12. A DRAM array as defined in claim 11 further comprising:
    a word line decoder connected to the bus to receive bus address signals and to deliver a word line select signal in response to a predetermined bus address signal; and wherein:
    the word line selector is connected to the word line decoder to receive the word line select signal and apply the word line select signal to the selected word line.

13. An embedded DRAM array which includes a bus connected to the DRAM array by which signals are communicated with the DRAM array, said DRAM array comprising:
    a Plurality of redundant functional elements, the elements comprise word lines;
    a substitution circuit responsive to signals communicated over the bus to electrically connect selected ones of the redundant elements as fully functional replacements for corresponding defective elements of the DRAM array and to electrically disconnect the defective elements and any not-selected redundant elements from operation within the DRAM array; and wherein:
    the redundant elements comprise word lines;
    the substitution circuit comprises a word line selector which connects selected ones of the word lines to function in response to bus address signals;
    a word line decoder connected to the bus to receive bus address signals and to deliver a word line select signal in response to a predetermined bus address signal;
    the word line selector connected to the word line decoder to receive the word line select signal and apply the word line select signal to the selected word line; and further comprising:
    a group word line selector connected to a predetermined group of word lines and to the word line selector, the group word line selector is further connected to the bus to receive word line address signals indicative of the ones of the group of word lines to which the group word line selector is connected; and wherein:

the word line selector applies the word line select signal to the group word line selector; and the group word line selector applies the word line select signal to the selected one of the word lines of the group of word lines corresponding to the word line address signals applied to the group word line selector.

14. A DRAM array as defined in claim 13 wherein:

the group word line selector is connected to a group of four word lines and applies the word line select signal to a selected one of the four connected word lines.

15. A DRAM array as defined in claim 13 wherein:

the DRAM array comprises a plurality of bit blocks;

each bit block comprises a plurality of bit lines, a plurality of word lines, and a plurality of memory cells arranged in a matrix-like configuration with each cell connected to a bit line and a word line;

the corresponding word lines of all of the bit blocks are connected together;

the group word line selector applies the word line select signal simultaneously to the selected ones of the corresponding word lines of all of the bit blocks.

16. An embedded DRAM array which includes a bus connected to the DRAM array by which signals are communicated with the DRAM array, said DRAM array comprising:

a plurality of redundant functional elements;

a substitution circuit responsive to signals communicated from the bus to electrically connect selected ones of the redundant elements as fully functional replacements for corresponding defective elements of the DRAM array and to electrically disconnect the defective elements and any not-selected redundant elements from operation within the DRAM array; and wherein:

the DRAM array is part of an IC which also includes a processor connected to the bus; and the processor executes a program which supplies signals to the bus for testing the redundant components of the DRAM array, determines functional and defective components based on the results of the test, and supplies the signals on the bus to the substitution circuit based on the determination of the functional and defective components.

17. A DRAM array as defined in claim 16 wherein:

the processor executes the program to determine the functional and defective components each time that power is initially supplied to the DRAM array.

18. A DRAM array as defined in claim 16 wherein the IC is a SLIC.

19. A DRAM array embedded in a SLIC, comprising:

a bus having a plurality of conductors over which address, control and data signals are supplied to the DRAM array from other components of the SLIC;

a predetermined plurality of bit blocks, each bit block having a plurality of bit lines and a plurality of word lines, the numbers of bit lines and word lines being greater than the number of bit lines and word lines required for a functional DRAM array; and a selector circuit connected to the bus and the bit blocks and responsive to control signals supplied on the bus to connect selected ones less than all of the word lines or the bit lines to the bus for response to address signals from the bus and to prevent the ones of the word or bit lines other than the selected ones from responding to address signals.

20. A DRAM array as defined in claim 19 wherein:

the number of bit blocks of the predetermined plurality is at least one greater than a predetermined number of bit blocks required for a fully functional DRAM array; and the selector circuit comprises a bit block selector which connects selected ones of the bit blocks to the bus to communicate data signals with the bus in response to bit line address signals and to prevent other ones of bit blocks from communicating data signals with the bus in response to bit line address signals.

21. A DRAM array as defined in claim 19 wherein:

each bit block includes a predetermined plurality of word line groups, the number of word line groups of the predetermined plurality of word lines is at least one greater than the number of word line groups required for a fully functional DRAM array, each group having at least one word line; and the selector circuit comprises a word line selector which connects selected ones of the word line groups to the bus to respond to word line address signals supplied on the bus and to disconnect other ones of word line groups from the bus and prevent the other ones of the word lines from responding to word line address signals on the bus.

22. A DRAM array as defined in claim 21 further comprising:

a word line decoder for responding to the word line address signals on the bus; and a group word line selector connected to a plurality of word lines connected to the bit blocks and constituting a group of word lines, the group word line selector responding to word line address signals from the bus; and wherein the word line selector is connected between the word line decoder and the group word line selector.

23. A method of substituting selected ones of a plurality of redundant functional elements for defective elements in a DRAM array embedded in an IC which includes a bus connected to the DRAM array by which signals are communicated with the DRAM array, said method comprising the steps of:

electrically switching selected ones of the plurality redundant elements into operation in the DRAM array as fully functional replacements for corresponding defective elements of the DRAM array;

electrically switching the defective elements and any not-selected redundant elements out of operation in the DRAM array; and sending substitution signals on the bus to control the electrical switching.

24. A method as defined in claim 23 further comprising the steps of:

storing the substitution signals in registers; and maintaining the selected ones of the redundant elements in operation and maintaining the defective and not-selected redundant elements out of operation in response to the substitution signal stored in the registers.

25. A method as defined in claim 23 wherein the redundant elements comprise a plurality of bit blocks, the predetermined number of bit blocks being at least one greater than a predetermined number of bit blocks required for a fully functional DRAM array, each bit block comprising a plurality of bit lines; and said method further comprises the steps of:

electrically switching selected ones of the bit blocks to the bus to read and write data signals to and from the bus over the bit lines.

26. A method as defined in claim 23 wherein the redundant elements comprise a plurality of word line groups, and said method further comprises the steps of:

electrically switching selected ones of the word line groups of each bit block to function in response to bus word line address signals.

27. A method as defined in claim 26 further comprising the steps of:

electrically switching a predetermined group of word line groups to function in response to bus word line address signals.

28. A method as defined in claim 23 further comprising the steps of:

executing a test program for testing the redundant components of the DRAM array;

determining the functional and defective components based on the results of the test program; and determining which of the redundant elements to electrically switch into and out of operation based on the results of the test program.

29. A method as defined in claim 28 further comprising the step of:

executing the test program each time that power is initially supplied to the DRAM array.

30. A method as defined in claim 28 wherein the IC is a SLIC.

* * * * *